US010611925B2

(12) United States Patent
Park et al.

(10) Patent No.: US 10,611,925 B2
(45) Date of Patent: *Apr. 7, 2020

(54) COMPOSITION FOR WINDOW FILM, FLEXIBLE WINDOW FILM FORMED THEREFROM, AND FLEXIBLE DISPLAY DEVICE COMPRISING SAME

(71) Applicants: SAMSUNG SDI CO., LTD., Yongin-si, Gyeonggi-do (KR); SAMSUNG ELECTRONICS CO., LTD., Suwon-si, Gyeonggi-do (KR)

(72) Inventors: Si Kyun Park, Suwon-si (KR); Kyoung Ku Kang, Suwon-si (KR); Jung Hyo Lee, Suwon-si (KR); Jin Hee Choi, Suwon-si (KR); Sung Han Kim, Suwon-si (KR); Joo Hui Kim, Suwon-si (KR); Nak Hyun Sung, Suwon-si (KR); Eun Su Lee, Suwon-si (KR)

(73) Assignees: Samsung SDI CO., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 108 days.

This patent is subject to a terminal disclaimer.

(21) Appl. No.: 15/538,617

(22) PCT Filed: Dec. 22, 2015

(86) PCT No.: PCT/KR2015/014105
§ 371 (c)(1),
(2) Date: Jun. 21, 2017

(87) PCT Pub. No.: WO2016/105088
PCT Pub. Date: Jun. 30, 2016

(65) Prior Publication Data
US 2017/0349787 A1    Dec. 7, 2017

(30) Foreign Application Priority Data

Dec. 23, 2014 (KR) .................. 10-2014-0187616

(51) Int. Cl.
| | | |
|---|---|---|
| C09D 183/06 | (2006.01) | |
| G06F 3/041 | (2006.01) | |
| C08G 77/38 | (2006.01) | |
| C08J 7/04 | (2020.01) | |
| C09D 5/00 | (2006.01) | |
| G06F 3/044 | (2006.01) | |
| H01L 27/32 | (2006.01) | |
| H01L 51/52 | (2006.01) | |
| C08G 77/14 | (2006.01) | |

(52) U.S. Cl.
CPC .......... *C09D 183/06* (2013.01); *C08G 77/38* (2013.01); *C08J 7/047* (2013.01); *C09D 5/00* (2013.01); *G06F 3/041* (2013.01); *G06F 3/044* (2013.01); *H01L 27/323* (2013.01); *H01L 51/5246* (2013.01); *H01L 51/5281* (2013.01); *C08G 77/14* (2013.01); *C08J 2367/02* (2013.01); *C08J 2483/06* (2013.01); *G06F 2203/04102* (2013.01); *G06F 2203/04103* (2013.01); *H01L 27/3244* (2013.01); *H01L 51/5237* (2013.01); *H01L 2251/5338* (2013.01)

(58) Field of Classification Search
CPC ...... C09D 183/06; C09D 5/00; C09D 183/10; C08J 7/047; C08J 2483/06; C08J 2367/02; C08J 2483/10; C08J 5/18; C08G 77/38; C08G 77/14; C08G 77/42; C08G 77/08; C08L 83/10; C08L 83/06; H01L 51/5281; H01L 51/5246; H01L 27/323; H01L 51/5237; H01L 2251/5338; H01L 24/3244; G06F 3/041; G06F 3/044; G06F 2203/04103; G06F 2203/04102; C08K 5/0025
See application file for complete search history.

(56) References Cited

U.S. PATENT DOCUMENTS

| | | | |
|---|---|---|---|
| 5,120,811 | A | 6/1992 | Glotfelter et al. |
| 5,191,045 | A | 3/1993 | Funaki et al. |
| 5,449,731 | A | 9/1995 | Suzuki et al. |
| 6,048,910 | A | 4/2000 | Furuya et al. |
| 6,440,569 | B1 | 8/2002 | Kanamori et al. |
| 7,303,785 | B2 | 12/2007 | Ogihara et al. |
| 7,541,134 | B2 | 6/2009 | Iwabuchi et al. |

(Continued)

FOREIGN PATENT DOCUMENTS

| | | |
|---|---|---|
| CN | 105646881 A | 6/2016 |
| JP | 07-118563 | 5/1995 |

(Continued)

OTHER PUBLICATIONS

International Search Report for corresponding PCT Application No. PCT/KR2015/014105, dated Mar. 31, 2016, with English translation (6 pages).

(Continued)

*Primary Examiner* — Sanza L. McClendon
(74) *Attorney, Agent, or Firm* — Lewis Roca Rothgerber Christie LLP (57) ABSTRACT

Provided are: a composition for a window film, containing a siloxane resin including chemical formula 1 below and an iodonium ion-containing photo-cationic initiator; a flexible window film formed therefrom; and a flexible display device comprising the same. Chemical formula 1: $(R^1SiO_{3/2})_x (R^2R^3SiO_{2/2})_y$.

15 Claims, 2 Drawing Sheets

(56) References Cited

U.S. PATENT DOCUMENTS

| | | | |
|---|---|---|---|
| 9,598,609 B2* | 3/2017 | Bae | C09D 183/06 |
| 9,617,449 B2* | 4/2017 | Bae | C09D 183/06 |
| 9,811,192 B2* | 11/2017 | Woo | G06F 1/1652 |
| 9,914,851 B2* | 3/2018 | Woo | C09D 183/06 |
| 2003/0020049 A1 | 1/2003 | Payne et al. | |
| 2007/0298349 A1 | 12/2007 | Zhang et al. | |
| 2008/0058441 A1 | 3/2008 | Watanabe et al. | |
| 2008/0097066 A1 | 4/2008 | Tsuchida et al. | |
| 2008/0280149 A1 | 11/2008 | Higuchi et al. | |
| 2009/0269504 A1 | 10/2009 | Liao | |
| 2010/0029804 A1 | 2/2010 | Nakayama et al. | |
| 2010/0092895 A1 | 4/2010 | Zhang et al. | |
| 2011/0230584 A1 | 9/2011 | Araki et al. | |
| 2011/0317239 A1 | 12/2011 | Mori et al. | |
| 2013/0071669 A1 | 3/2013 | Kodaira et al. | |
| 2013/0331476 A1 | 12/2013 | Bae et al. | |
| 2014/0154626 A1 | 6/2014 | Bujalski et al. | |
| 2014/0179869 A1 | 6/2014 | Ko et al. | |
| 2015/0093585 A1 | 4/2015 | Bae et al. | |
| 2015/0155526 A1 | 6/2015 | Lee et al. | |
| 2018/0282484 A1 | 10/2018 | Woo et al. | |

FOREIGN PATENT DOCUMENTS

| | | |
|---|---|---|
| JP | 2007-176542 A | 7/2007 |
| KR | 10-2008-0099160 A | 11/2008 |
| KR | 10-2009-0116751 A | 11/2009 |
| KR | 10-2010-0004941 A | 1/2010 |
| KR | 10-2010-0134689 A | 12/2010 |
| KR | 10-2012-0139616 A | 12/2012 |
| KR | 10-2014-0004568 A | 1/2014 |
| KR | 10-2014-0134147 A | 11/2014 |
| KR | 10-2016-0065411 A | 6/2016 |
| TW | 201033289 A1 | 9/2010 |
| WO | WO 2009/090867 A1 | 7/2009 |
| WO | WO 2013/187699 A1 | 12/2013 |

OTHER PUBLICATIONS

Written Opinion for corresponding PCT Application No. PCT/KR2015/014105, dated Mar. 31, 2016 (6 pages).
International Search Report corresponding to PCT Application No. PCT/KR2015/012231, dated Feb. 24, 2016, with English Translation (6 pages).
Written Opinion corresponding to PCT Application No. PCT/KR2015/012231, dated Feb. 24, 2016 (4 pages).
International Search Report for corresponding PCT Application No. PCT/KR2015/013827, dated May 13, 2016, with English Translation (6 pages).
Written Opinion for corresponding PCT Application No. PCT/KR2015/013827, dated May 13, 2016 (6 pages).
Machine translation of WO 2009/090867 into the English language.
Korean Office action corresponding to Korean patent application No. 10-2014-0172471, dated Jan. 17, 2018 (5 pages).
Taiwan Patent Office action dated May 24, 2016, issued in TW Application No. 104139529, 4 pages.
"Embedded Antifuse NVM: A Mission of Critical IP for Display Driver ICs" authored by Cheng and available online at the url: www.embedded.com/print/4215607.
U.S. Office Action dated Feb. 10, 2017, issued in U.S. Appl. No. 14/951,328 (7 pages).
U.S. Office Action dated Feb. 23, 2017, issued in U.S. Appl. No. 14/956,287 (8 pages).
U.S. Notice of Allowance dated Jul. 3, 2017, issued in U.S. Appl. No. 14/951,328 (13 pages).
U.S. Office Action dated Jul. 19, 2017, issued in U.S. Appl. No. 14/956,287 (8 pages).
U.S. Office Action dated Aug. 23, 2018, issued in U.S. Appl. No. 15/531,672 (8 pages).
U.S. Office Action dated Dec. 13, 2018, issued in U.S. Appl. No. 15/535,379 (10 pages).
China Office Action in corresponding China Application No. 201580070197.9, China Office Action dated Sep. 24, 2019 (6 pgs.).

* cited by examiner

COMPOSITION FOR WINDOW FILM, FLEXIBLE WINDOW FILM FORMED THEREFROM, AND FLEXIBLE DISPLAY DEVICE COMPRISING SAME

CROSS-REFERENCE TO RELATED APPLICATIONS

This application is a National Phase Patent Application and claims priority to and the benefit of International Application Number PCT/KR2015/014105, filed on Dec. 22, 2015, which claims priority to and the benefit of Korean Application No. 10-2014-0187616, filed on Dec. 23, 2014, the entire contents of each of which are incorporated herein by reference.

BACKGROUND

1. Field

The present invention relates to a composition for window films, a flexible window film produced therefrom, and a flexible display comprising the same.

2. Description of the Related Art

Recently, with the replacement of a glass substrate or a high hardness substrate with a film in a display, a flexible display capable of being folded or unfolded has been developed in the related art. The flexible display is thin and light, has high impact resistance, can be folded and unfolded, and thus can be manufactured in various shapes.

In such a flexible display, not only a substrate but also various elements are required to have flexibility. Particularly, a window film formed of a composition including a siloxane resin and an initiator may be applied to displays such as mobile phones or tablet PCs. Since the window film is disposed at the outermost side of the display, it is necessary for the window film to have good properties in terms of flexibility, high hardness, and light resistant reliability.

SUMMARY

It is one aspect of the present invention to provide a composition for window films, which can realize a flexible window film having good properties in terms of hardness, flexibility and optical reliability such as light resistant reliability. It is another aspect of the present invention to provide a flexible window film, which has good properties in terms of hardness, flexibility and optical reliability such as light resistant reliability, and a flexible display including the same.

In accordance with one aspect of the present invention, a composition for window films includes a siloxane resin comprising a compound represented by Chemical Formula 1 and an iodonium ion-containing photocationic initiator:

<Chemical Formula 1>

(wherein Chemical Formula 1, $R^1$, $R^2$ and $R^3$ are the same as defined in the detailed description of the invention, and $0 < x \leq 1$, $0 \leq y < 1$, $x+y=1$).

In accordance with another aspect of the present invention, a flexible window film includes: a base layer and a coating layer formed on one surface of the base layer, wherein the coating layer includes an iodonium ion-containing photocationic initiator.

In accordance with a further aspect of the present invention, a flexible display includes the flexible window film as set forth above.

The present invention provides a composition for window films, which can realize a flexible window film having good properties in terms of hardness, flexibility and optical reliability such as light resistant reliability.

The present invention provides a flexible window film, which has good properties in terms of hardness, flexibility and optical reliability such as light resistant reliability, and a flexible display including the same.

DETAILED DESCRIPTION

Embodiments of the present invention will be described in detail with reference to the accompanying drawings. It should be understood that the present invention is not limited to the following embodiments and may be embodied in different ways. In the drawings, portions irrelevant to the description will be omitted for clarity. Like components will be denoted by like reference numerals throughout the specification.

Herein, spatially relative terms such as "upper" and "lower" are defined with reference to the accompanying drawings. Thus, it will be understood that the term "upper surface" can be used interchangeably with the term "lower surface". In addition, when an element such as a layer or a film is referred to as being placed "on" another element, it can be directly placed on the other element, or intervening element(s) may be present. On the other hand, when an element is referred to as being placed "directly on" another element, there are no intervening element(s) therebetween.

Herein, the term "pencil hardness" is measured on a coating layer of a window film using a pencil hardness tester (Heidon) in accordance with JIS K5400. In measurement of pencil hardness, pencils of 6B to 9H (Mitsubishi Co., Ltd.) are used. Specifically, pencil hardness is measured under conditions of a pencil load of 1 kg on the coating layer, a scratch angle of 45°, and a scratch speed of 60 mm/min. When the coating layer has one or more scratches after being tested 5 times using a certain pencil, pencil hardness is measured again using another pencil having one-level lower pencil hardness than the previous pencil, and the maximum value of pencil hardness allowing no scratch to be observed all five times on the coating layer is taken as pencil hardness of the coating layer.

Herein, the term "radius of curvature" refers to a minimum radius of a jig causing no cracks on a window film specimen when the window film specimen is wound around the jig for measuring a radius of curvature (CFT-200R, COVOTECH Co., Ltd.), kept wound for 5 seconds, unwound, and then observed with the naked eye to determine whether the specimen has cracks. Here, a radius of curvature in a compressive direction is measured when the specimen is wound around the jig such that a window coating layer of the window film contacts a surface of the jig, and a radius of curvature in a tensile direction is measured when the specimen is wound around the jig such that a base layer of the window film contacts the jig. Here, the window film specimen has a thickness of 50 μm to 300 μm.

Herein, "ΔY.I." refers to a difference (Y2-Y1) between a yellow index (Y1) measured on a window film under a D65 light source at 2° (angle between the window film and the light source) using a colorimeter (CM3600A, Konica Minolta) and a yellow index (Y2) measured on the window film by the same method after irradiating the window film at a peak wavelength of 306 nm for 72 hours using a light resistance tester (CT-UVT, Core Technology Inc.).

Herein, the term "(meth)acryl" refers to acryl and/or methacryl.

Herein, unless otherwise stated, "substituted" means that at least one hydrogen atom in a functional group is substituted with a hydroxyl group, an unsubstituted $C_1$ to $C_{10}$ alkyl group, a $C_1$ to $C_{10}$ alkoxy group, a $C_3$ to $C_{10}$ cycloalkyl group, a $C_6$ to $C_{20}$ aryl group, a $C_7$ to $C_{20}$ arylalkyl group, a benzophenone group, a $C_6$ to $C_{20}$ aryl group substituted with a $C_1$ to $C_{10}$ alkyl group, or a $C_1$ to $C_{10}$ alkyl group substituted with a $C_1$ to $C_{10}$ alkoxy group.

Herein, the term "crosslinkable functional group" means a functional group allowing crosslinking reaction by heat and/or light. For example, the crosslinkable functional group means an epoxy group, an epoxy group-containing group, a glycidyl group, a glycidyl group-containing group, a glycidoxy group, a glycidoxy group-containing group, an oxetanyl group, an oxetanyl group-containing group, and the like. Specifically, the crosslinkable functional group means an epoxy group; a glycidyl group; a glycidoxy group; an oxetanyl group; an oxetanyloxy group; an epoxy group, a glycidyl group, a glycidoxy group, an epoxylated $C_5$ to $C_{20}$ cycloalkyl group, an epoxylated $C_1$ to $C_{10}$ alkyl group, an oxetanyl group or an oxetanyloxy group-containing $C_1$ to $C_{20}$ alkyl group; or an epoxy group, a glycidyl group, a glycidoxy group, an epoxylated $C_5$ to $C_{20}$ cycloalkyl group, an epoxylated $C_1$ to $C_{10}$ alkyl group, or an oxetanyl group or oxetanyloxy group-containing $C_5$ to $C_{20}$ cycloalkyl group, and may be unsubstituted or substituted with another element.

Herein, the term "halogen" means fluorine, chlorine, bromine, or iodine.

Herein, "Ec" refers to a (3,4-epoxycyclohexyl)ethyl group, "Me" refers to a methyl group, "Et" refers to an ethyl group, "Gp" refers to a 3-glycidoxypropyl group, and "Op" refers to a 3-oxetanylpropyl group.

Hereinafter, a composition for window films according to one embodiment of the present invention will be described.

The composition for window films according to the embodiment includes a siloxane resin comprising a compound represented by Chemical Formula 1 and an iodonium ion (I⁺)-containing photocationic initiator:

$(R^1SiO_{3/2})_x(R^2R^3SiO_{2/2})_y$      <Chemical Formula 1>

(wherein Chemical Formula 1, $R^1$ is a crosslinkable functional group; $R^2$ and $R^3$ are each independently hydrogen, a crosslinkable group, an unsubstituted or substituted $C_1$ to $C_{20}$ alkyl group, or an unsubstituted or substituted $C_5$ to $C_{20}$ cycloalkyl group, at least one of $R^2$ and $R^3$ being an unsubstituted or substituted $C_1$ to $C_{20}$ alkyl group; and $0<x\leq1$, $0\leq y<1$, $x+y=1$).

With the siloxane resin comprising the compound represented by Chemical Formula 1, the composition for window films according to the embodiment can improve hardness and flexibility of a window film formed of the same. In addition, the siloxane resin comprising the compound represented by Chemical Formula 1 is prepared through adjustment of the content of a silicon monomer for each of $(R^1SiO_{3/2})$ and $(R^2R^3SiO_{2/2})$, thereby allowing easy adjustment of hardness and flexibility of the window film. In one embodiment, in Chemical Formula 1, $0.20\leq x\leq0.999$ and $0.001\leq y\leq0.80$, more specifically $0.20\leq x\leq0.99$ and $0.01\leq y\leq0.80$, more specifically $0.80\leq x\leq0.99$ and $0.01\leq y\leq0.20$. In another embodiment, the compound of Chemical Formula 1 may be represented by $(R^{1a}SiO_{3/2})_{x1}(R^{1b}SiO_{3/2})_{x2}$ ($R^{1a}$ and $R^{1b}$ being different crosslinkable functional groups, and $0<x1<1$, $0<x2<1$ and $x1+x2=1$), specifically $0.70\leq x1<1$, $0<x2\leq0.30$, specifically $0.80\leq x1<1$ and $0<x2\leq0.20$, more specifically $0.85\leq x1\leq0.99$ and $0.01\leq x2\leq0.15$. Within this range, the siloxane resin can improve hardness and flexibility of the window film. In Chemical Formula 1, $R^1$ can provide crosslinkability and flexibility to the composition for window films. Specifically, $R^1$ may be a (3,4-epoxycyclohexyl)methyl group, a (3,4-epoxycyclohexyl)ethyl group, a (3,4-epoxycyclohexyl)propyl group, a 3-glycidoxypropyl group, a 3-oxetanylmethyl group, a 3-oxetanylethyl group, a 3-oxetanylpropyl group, a 3-oxetanyloxy group, or the like. In Chemical Formula 1, $R^2$ and $R^3$ can provide crosslinkability and flexibility to the composition for window films. Specifically, $R^2$ may be an unsubstituted or substituted $C_1$ to $C_{20}$ alkyl group and $R^3$ may be a crosslinkable functional group. Here, hardness of the window film can be further improved by improving crosslinkability of the composition for window films. More specifically, $R^2$ and $R^3$ are each independently a (3,4-epoxycyclohexyl)methyl group, a (3,4-epoxycyclohexyl)ethyl group, a (3,4-epoxycyclohexyl)propyl group, a glycidoxy propyl group, a methyl group, an ethyl group, an n-propyl group, or an isopropyl group.

Specifically, the siloxane resin comprising the compound represented by a Chemical Formula 1 may include at least one of compounds represented by Chemical Formula 1-1 to 1-13, without being limited thereto:

$(EcSiO_{3/2})_x(EcMeSiO_{2/2})_y$      <Chemical Formula 1-1>

$(EcSiO_{3/2})_x((Me)_2SiO_{2/2})_y$      <Chemical Formula 1-2>

$(EcSiO_{3/2})_x(MeEtSiO_{2/2})_y$      <Chemical Formula 1-3>

$(EcSiO_{3/2})_x(GpMeSiO_{2/2})_y$      <Chemical Formula 1-4>

$(GpSiO_{3/2})_x(EcMeSiO_{2/2})_y$      <Chemical Formula 1-5>

$(GpSiO_{3/2})_x((Me)_2SiO_{2/2})_y$      <Chemical Formula 1-6>

$(GpSiO_{3/2})_x(MeEtSiO_{2/2})_y$      <Chemical Formula 1-7>

$(GpSiO_{3/2})_x(GpMeSiO_{2/2})_y$      <Chemical Formula 1-8>

$(OpSiO_{3/2})_x(EcMeSiO_{2/2})_y$      <Chemical Formula 1-9>

$(OpSiO_{3/2})_x((Me)_2SiO_{2/2})_y$      <Chemical Formula 1-10>

$(OpSiO_{3/2})_x(MeEtSiO_{2/2})_y$      <Chemical Formula 1-11>

$(OpSiO_{3/2})_x(GpMeSiO_{2/2})_y$      <Chemical Formula 1-12>

(in Chemical Formula 1-1 to 1-12, $0<x<1$, $0<y<1$, and $x+y=1$).

$(EcSiO_{3/2})_{x1}(GpSiO_{3/2})_{x2}$      <Chemical Formula 1-13>

(in Chemical Formula 1-13, $0<x1<1$, $0<x2<1$, and $x1+x2=1$).

The siloxane resin comprising the compound represented by Chemical Formula 1 may have a weight average molecular weight of about 4,000 to about 100,000, specifically about 4,500 to about 10,000. Within this range, the siloxane resin can be easily produced and can exhibit good properties in terms of hardness and flexibility. The siloxane resin comprising the compound represented by about 1 may have a polydispersion index (PDI) of about 1.0 to about 3.0, specifically about 1.5 to about 2.5, and an epoxy equivalent weight of about 0.1 mol/100 g to about 1.0 mol/100 g, specifically about 0.3 mol/100 g to about 0.7 mol/100 g. Within these ranges of polydispersion index and epoxy equivalent weight, the siloxane resin can provide stable coating properties to the composition for window films.

The iodonium ion-containing photocationic initiator can secure high hardness and flexibility of the window film by sufficiently curing the siloxane resin comprising the compound represented by Chemical Formula 1 even under simple curing conditions. In addition, the iodonium ion-containing photocationic initiator can remarkably improve light resistant reliability while reducing initial yellow index, as compared with a photocationic initiator that contains other cations in addition to the iodonium ions.

Specifically, the iodonium ion-containing photocationic initiator may include onium salt compounds containing diaryliodonium such as diphenyliodonium, 4-methoxydiphenyliodonium, bis(4-methylphenyl)iodonium, bis(4-tert-butylphenyl)iodonium, bis(4-dodecylphenyl)iodonium, or (4-methylphenyl)[4-(2-methylpropyl)phenyl]iodonium; and an anion such as hexafluorophosphate($PF_6^-$), tetrafluoroborate($BF_4^-$), tetrakis(pentafluorophenyl)borate, hexafluoroantimonate ($SbF_6^-$), hexafluoroarsenate($AsF_6^-$), hexachloroantimonate($SbCl_6^-$), nitrate, para-toluenesulfonate, 9,10-dimethoxyanthracene-2-sulfonate, triflate, or perfluoro-1-butanesulfonate. These may be used alone or as mixtures thereof. For example, the iodonium ion-containing photocationic initiator may be diphenyliodonium hexafluorophosphate, (4-methylphenyl)[4-(2-methylpropyl)phenyl]iodonium hexafluorophosphate, bis(4-tert-butylphenyl)iodonium hexafluorophosphate, bis(4-tert-butylphenyl)iodonium hexafluoroantimonate, or a mixture thereof.

The iodonium ion-containing photocationic initiator may be present in an amount of about 1 part by weight to about 15 parts by weight, specifically about 1 part by weight to about 7 parts by weight, relative to 100 parts by weight of the siloxane resin comprising the compound represented by Chemical Formula 1. Within this range, the siloxane resin can be sufficiently cured without deterioration in transparency and light resistant reliability of the window film due to remaining initiator.

The composition for window films according to this embodiment may further include nanoparticles. The nanoparticles can further improve hardness of the window film. The nanoparticles may include at least one of silica, aluminum oxide, zirconium oxide, and titanium oxide, without being limited thereto. The nanoparticles may also be subjected to surface treatment with a silicone compound for mixing with the siloxane resin. The nanoparticles are not limited to a particular shape or size. Specifically, the nanoparticles may include spherical, flake, or amorphous particles. The nanoparticles may have an average particle size of about 1 nm to about 200 nm, specifically about 10 nm to about 50 nm. Within this range, the nanoparticles can increase hardness of the window film without affecting surface roughness and transparency of the window film. The nanoparticles may be present in an amount of about 0.1 parts by weight to about 60 parts by weight, specifically about 10 parts by weight to about 50 parts by weight, relative to 100 parts by weight of the siloxane resin comprising the compound represented by Chemical Formula 1. Within this range, the nanoparticles can increase hardness of the window film without affecting surface roughness and transparency thereof.

The composition for window films according to this embodiment may further include additives. The additives can provide additional functions to the window film. The additives may be any additives commonly used for window films in the related art. Specifically, the additives may include at least one of a UV absorbent, a reaction inhibitor, an adhesion promoter, a thixotropic agent, a conductivity imparting agent, a color adjusting agent, a stabilizer, an antistatic agent, an antioxidant, and a leveling agent, without being limited thereto. The reaction inhibitor may include ethynylcyclohexane, the adhesion promoter may be an epoxy or alkoxysilane group-containing silane compound, and the thixotropic agent may be fumed silica. The conductivity imparting agent may include metal powder such as silver powder, copper powder, aluminum powder, and the like, and the color adjusting agent may include pigments, dyes, and the like. The UV absorbent can improve light resistant reliability of the window film. The UV absorbent may be any typical absorbent known to those skilled in the art. Specifically, the UV absorbent may include at least one of triazine based, benzimidazole based, benzophenone based, benzotriazole based, and hydroxyphenyltriazine based UV absorbents, without being limited thereto. The additives may be present in an amount of about 0.01 parts by weight to about 5 parts by weight, specifically about 0.1 parts by weight to about 2.5 parts by weight, relative to 100 parts by weight of the siloxane resin comprising the compound represented by Chemical Formula 1. Within this range, the additives can improve hardness and flexibility of the window film while realizing effects thereof.

The composition for window films according to this embodiment may further include a solvent to improve coatability, wettability or processability. The solvent may include methylethylketone, methylisobutylketone, and propyleneglycol monomethyletheracetate, without being limited thereto.

The composition for window films according to this embodiment may have a viscosity of 50 cP to 2,000 cP at 25° C. Within this range, the composition allows easy formation of the window film.

Next, a method of preparing the siloxane resin comprising the compound represented by Chemical Formula 1 will be described in detail.

The siloxane resin comprising the compound represented by Chemical Formula 1 may be prepared through hydrolysis and condensation of a first silicon monomer only or of a monomer mixture including the first silicon monomer and a second silicon monomer. In one embodiment, the first silicon monomer may be present in an amount of about 20 mol % to about 99.9 mol % in the monomer mixture, specifically about 20 mol % to about 99 mol %, more specifically about 80 mol % to about 99 mol %, and the second silicon monomer may be present in an amount of about 0.1 mol % to about 80 mol % in the monomer mixture, specifically about 1 mol % to about 80 mol %, more specifically about 1 mol % to about 20 mol %. In another embodiment, one of the first and second silicon monomers may be preset in an amount of about 70 mol % to less than about 100 mol %, about 80 mol % to less than about 100 mol %, about 85 mol % to about 99 mol %, and the other silicon monomer may be present in an amount of more than about 0 mol % to about 30 mol %, more than about 0 mol % to 20 mol %, or about 1 mol % to 15 mol %. Within these ranges, the first and second silicon monomers can improve hardness and flexibility of the window film.

The first silicon monomer may include a silane compound represented by Chemical Formula 2 and the second silicon monomer may include a silane compound represented by Chemical Formula 3. These may be used alone or in combination thereof.

<Chemical Formula 2>

(wherein Chemical Formula 2, $R^1$ is the same as defined in Chemical Formula 1, and $R^4$, $R^5$ and $R^6$ are each independently a halogen, a hydroxyl group or a $C_1$ to $C_{10}$ alkoxy group).

<Chemical Formula 3>

(wherein Chemical Formula 3, $R^2$ and $R^3$ are the same as defined in Chemical Formula 1, and $R^7$ and $R^8$ are each independently a halogen, a hydroxyl group or a $C_1$ to $C_{10}$ alkoxy group).

Specifically, the first silicon monomer may include at least one selected from 2-(3,4-epoxycyclohexyl)ethyltriethoxysilane, 2-(3,4-epoxycyclohexyl)ethyltrimethoxysilane, 3-glycidoxypropyltrimethoxysilane, 3-glycidoxypropyltriethoxysilane, 3-oxetanylmethyltrimethoxysilane, 3-oxetanylethyltrimethoxysilane, 3-oxetanylpropyltrimethoxysilane, and 3-oxetanyloxytrimethoxysilane, without being limited thereto.

Specifically, the second silicon monomer may include at least one selected from 2-(3,4-epoxycyclohexyl)ethylmethyldiethoxysilane, dimethyldimethoxysilane, and (3-glycidoxypropyl)methyldiethoxysilane, without being limited thereto.

Hydrolysis and condensation of the monomer mixture may be performed by a typical method for preparation of a siloxane resin. Hydrolysis may include reacting the first silicon monomer alone or the monomer mixture of the first silicon monomer and the second silicon monomer in a mixture of water and at least one of an acid and a base. Specifically, the acid may be a strong acid such as HCl and $HNO_3$ and the base may be a strong base such as NaOH and KOH. Hydrolysis may be performed at about 20° C. to about 100° C. for about 10 minutes to about 7 hours. Under these conditions, hydrolysis efficiency of the silicon monomers can be improved. Condensation may be performed at about 20° C. to about 100° C. for about 10 minutes to about 12 hours under the same conditions as hydrolysis. Under these conditions, hydrolysis efficiency of the silicon monomers can be improved. A platinum catalyst may be further used in order to improve efficiency in hydrolysis and condensation. The platinum catalyst may include a vinylalkylsilane platinum complex including a Karstedt catalyst, platinum black, chloroplatinic acid, a chloroplatinic acid-olefin complex, a chloroplatinic acid-alcohol complex, or a mixture thereof.

Next, a composition for window films according to another embodiment of the invention will be described.

The composition for window films according to another embodiment may include a siloxane resin comprising a compound represented by Chemical Formula 1, an iodonium ion-containing photocationic initiator, and a crosslinking agent. The crosslinking agent can improve hardness of a window film by increasing the crosslinking degree thereof. The composition for window films according to this embodiment is substantially the same as the composition for window films according to the above embodiment except for the crosslinking agent. Thus, the following description will focus on the crosslinking agent.

The crosslinking agent may contain a crosslinkable functional group to further improve hardness of the window film. In addition, the crosslinking agent can further improve flexibility of the window film by increasing the content of $R^2R^3SiO_{2/2}$ in the composition represented by Chemical Formula 1. The crosslinking agent may further include at least one of a non-cyclic aliphatic hydrocarbon group, a cyclic aliphatic hydrocarbon group, an aromatic hydrocarbon group, and a hydrogenated aromatic hydrocarbon group to improve flexibility of the window film.

Specifically, the crosslinking agent may include at least one of a non-cyclic aliphatic epoxy monomer, a cyclic aliphatic epoxy monomer, an aromatic epoxy monomer, and a hydrogenated aromatic epoxy monomer. These crosslinking agents may be used alone or as a mixture thereof.

Examples of the non-cyclic aliphatic epoxy monomer may include 1,4-butanediol diglycidyl ether, 1,6-hexanediol diglycidyl ether, neopentylglycol diglycidyl ether, trimethylolpropane triglycidyl ether, polyethyleneglycol diglycidyl ether, glycerin triglycidyl ether, polypropyleneglycol diglycidyl ether; polyglycidyl ethers of polyetherpolyol obtained by adding one or more types of alkylene oxide to aliphatic polyhydric alcohols, such as ethylene glycol, propylene glycol, glycerin, and the like; diglycidyl esters of aliphatic long-chain dibasic acids; monoglycidyl ethers of higher aliphatic alcohol; glycidyl ethers of higher fatty acids; epoxylated soybean oil; epoxy stearic acid butyl; epoxy stearic acid octyl; epoxylated linseed oil; and epoxylated polybutadiene.

The cyclic aliphatic epoxy monomer is a compound having at least one epoxy group in an alicyclic group. Specifically, the cyclic aliphatic epoxy monomer may include alicyclic epoxy carboxylate and alicyclic epoxy (meth)acrylate. More specifically, the cyclic aliphatic epoxy monomer may include (3,4-epoxycyclohexyl)methyl-3',4'-epoxycyclohexanecarboxylate, diglycidyl 1,2-cyclohexanedicarboxylate, 2-(3,4-epoxycyclohexyl-5,5-spiro-3,4-epoxy)cyclohexane-metha-dioxane, bis(3,4-epoxycyclohexylmethyl)adipate, bis(3,4-epoxy-6-methylcyclohexylmethyl)adipate, 3,4-epoxy-6-methylcyclohexylmethyl-3',4'-epoxy-6'-methylcyclohexanecarboxylate, ε-caprolactone modified 3,4-epoxycyclohexylmethyl-3',4'-epoxy-cyclohexanecarboxylate, trimethylcaprolactone modified 3,4-epoxycyclohexylmethyl-3',4'-epoxycyclohexanecarboxylate, β-methyl-δ-valerolactone modified 3,4-epoxycyclohexylmethyl-3',4'-epoxycyclohexanecarboxylate, 1,4-cyclohexanedimethanol bis(3,4-epoxycyclohexanecarboxylate), ethyleneglycol di(3,4-epoxycyclohexylmethyl)ether, ethylenebis(3,4-epoxycyclohexanecarboxylate), 3,4-epoxycyclohexylmethyl(meth)acrylate, 4-vinylcyclohexen dioxide, vinylcyclohexene monoxide, and the like.

The aromatic epoxy monomer may include bisphenol type epoxy resins such as diglycidyl ether of bisphenol A, diglycidyl ether of bisphenol F, and diglycidyl ether of bisphenol S; novolac type epoxy resins such as a phenol novolac epoxy resin, a cresol novolac epoxy resins, and a hydroxybenzaldehyde phenol novolac epoxy resin; and polyfunctional epoxy resins such as glycidyl ether of tetrahydroxyphenyl methane, glycidyl ether of tetrahydroxybenzophenone, and epoxylated polyvinyl phenol.

The hydrogenated aromatic epoxy monomer means a monomer obtained by selective hydrogenation of an aromatic epoxy monomer in the presence of a catalyst under pressure. The aromatic epoxy monomer for the hydrogenated aromatic epoxy monomer may include the aromatic epoxy monomer described above.

The crosslinking agent may be present in an amount of about 0.1 parts by weight to about 50 parts by weight, specifically about 1 part by weight to about 40 parts by weight, more specifically about 5 parts by weight to about 25 parts by weight, relative to 100 parts by weight of the siloxane resin comprising the compound represented by Chemical Formula 1. Within this range, the window film can exhibit high flexibility and hardness.

The composition according to this embodiment may further include at least one of the nanoparticles, the additives and the solvent described above.

Figure 1:
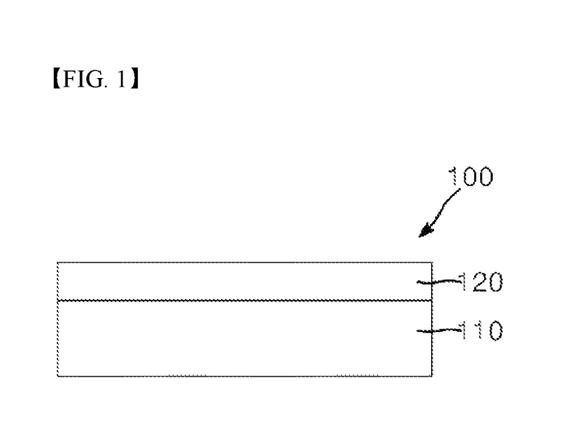
FIG. 1 is a cross-sectional view of a flexible window film according to one embodiment of the present invention.

Next, a flexible window film according to one embodiment will be described with reference to FIG. 1. FIG. 1 is a cross-sectional view of a flexible window film according to one embodiment of the invention.

Referring to FIG. 1, a flexible window film (100) according to one embodiment of the invention may include a base layer (110) and a coating layer (120), in which the coating layer (120) may include an iodonium ion-containing photocationic initiator. As a result, the flexible window film (100) may have a ΔY.I. of about 1.0 or less, specifically about 0.1 to about 1.0. Within this range, the flexible window film can be used as a window film for flexible displays.

The base layer (110) can improve mechanical strength of the flexible window film (100) by supporting the coating layer (120) of the flexible window film (100). The base layer (110) may be attached to a display part, a touchscreen panel or a polarizing plate via an adhesive layer or the like.

The base layer (110) may be formed of an optically transparent flexible resin. For example, the resin may include polyester resins including polyethylene terephthalate, polyethylene naphthalate, polybutylene terephthalate, polybutylene naphthalate, and the like, polycarbonate resins, polyimide resins, polystyrene resins, poly(meth)acrylate resins including poly(methyl methacrylate), and the like. These resins may be used alone or as a mixture thereof.

The base layer (110) may have a thickness of about 10 μm to about 200 μm, specifically about 20 μm to about 150 μm, more specifically about 50 μm to about 100 μm. Within this range, the base layer can be used in the flexible window film.

The coating layer (120) may be formed on the base layer (110) to protect the base layer (110), the display part, the touchscreen panel or the polarizing plate, and has high flexibility and high hardness to be used for a flexible display.

The coating layer (120) may have a thickness of about 5 μm to about 100 μm, specifically about 10 μm to about 80 μm. Within this range, the coating layer can be used in the flexible window film.

Although not shown in FIG. 1, functional surface layers such as an anti-reflection layer, an anti-glare layer, and a hard coating layer may be formed on the other surface of the coating layer (120) to provide additional functions. In addition, although not shown in FIG. 1, the coating layer (120) may be further formed on the other surface of the base layer (110).

The flexible window film (100) is optically transparent and may be used in a transparent display. Specifically, the flexible window film (100) may have a transmittance of about 88% or more, specifically about 88% to about 100%, in the visible range, specifically in a wavelength range of about 400 nm to about 800 nm. Within this range, the flexible window film can be used as a window film for flexible displays.

The flexible window film (100) may have a pencil hardness of about 7H or more and a radius of curvature of about 5.0 mm or less. Within this range, the flexible window film can be used as a window film for flexible displays. Specifically, the flexible window film (100) may have a pencil hardness of about 7H to about 9H and a radius of curvature of about 0.1 mm to about 5.0 mm.

The flexible window film (100) may have a yellow index of about 2.5 or less, as measured under a D65 light source at 2° (angle between the window film and the light source) using a colorimeter (CM3600A, Konica Minolta). Within this range, the flexible window film can reduce yellowness when viewed with the naked eye.

The flexible window film (100) may have a thickness of about 50 μm to about 300 μm. Within this range, the flexible window film can be used as a window film for flexible displays.

The flexible window film (100) may be formed by coating and curing the composition for window films according to the embodiments on the base layer (110).

A method of coating the composition for window films onto the base layer (110) is not particularly limited. For example, the composition for window films may be coated onto the base layer by bar coating, spin coating, dip coating, roll coating, flow coating, or die coating. The composition for window films may be coated to a thickness of about 5 μm to about 100 μm on the base layer (110). Within this thickness range, a desired coating layer can be secured while providing good hardness, flexibility and reliability.

Curing is performed to form the coating layer by curing the composition for window films, and may include at least one of photocuring and heat curing. Photocuring may include irradiating the coated composition at a dose of about 10 mJ/cm$^2$ to about 1,000 mJ/cm$^2$ at a wavelength of about 400 nm or less. Heat curing may be performed at a temperature of about 40° C. to about 200° C. for 1 hour to about 30 hours. Under these conditions, the composition for window films can be sufficiently cured. For example, heat curing may be performed after photocuring in order to achieve higher hardness of the coating layer.

Before curing the composition for window films coated onto the base layer (110), the method may further include drying the composition. When curing is performed after drying, it is possible to prevent increase in surface roughness of the coating layer due to photocuring or heat curing for a long period of time. Drying may be performed at about 40° C. to about 200° C. for about 1 minute to about 30 hours, without being limited thereto.

Figure 2:
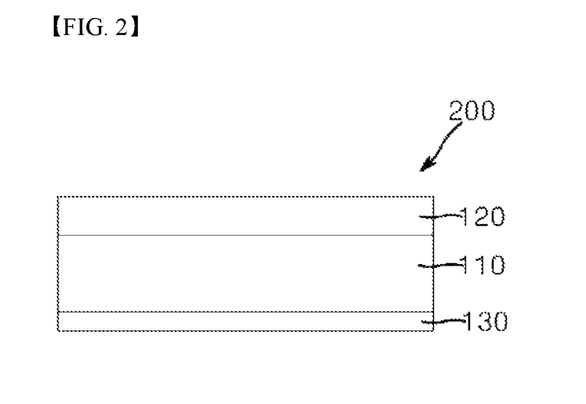
FIG. 2 is a cross-sectional view of a flexible window film according to another embodiment of the present invention.

Next, a flexible window film according to another embodiment will be described with reference to FIG. 2. FIG. 2 is a cross-sectional view of a flexible window film according to another embodiment of the invention.

Referring to FIG. 2, a flexible window film (200) according to another embodiment of the invention may include a base layer (110), a coating layer (120) formed on one surface of the base layer (110), and an adhesive layer (130) formed on the other surface of the base layer (110), in which the coating layer (120) may include an iodonium ion-containing photocationic initiator. The adhesive layer (130) formed on the other surface of the base layer (110) can facilitate adhesion between the flexible window film and a touchscreen panel, a polarizing plate or a display part. The flexible window film according to this embodiment is substantially the same as the flexible window film according to the above embodiment excluding the adhesive layer. Thus, the following description will be given of the adhesive layer alone.

The adhesive layer (130) attaches a polarizing plate, a touchscreen panel, or a display part to the flexible window film (200) to be disposed under the flexible window film (200), and may be formed of an adhesive composition for the adhesive layer. Specifically, the adhesive layer (130) may be formed of an adhesive composition comprising an adhesive resin such as a (meth)acrylic resin, a urethane resin, a silicone resin, and an epoxy resin, a curing agent, a photoinitiator, and a silane coupling agent.

The (meth)acrylic resin is a (meth)acrylic copolymer having an alkyl group, a hydroxyl group, an aromatic group, a carboxylic acid group, an alicyclic group, a hetero-alicyclic group, and the like, and may include a typical (meth)acrylic copolymer. Specifically, the (meth)acrylic resin may be formed of a monomer mixture including at least one of a (meth)acrylic monomer containing a $C_1$ to $C_{10}$ unsubstituted alkyl group, a (meth)acrylic monomer containing a $C_1$ to $C_{10}$ alkyl group having at least one hydroxyl group, a (meth)acrylic monomer containing a $C_6$ to $C_{20}$ aromatic group, a (meth)acrylic monomer containing a carboxylic acid group, a (meth)acrylic monomer containing a $C_3$ to $C_{20}$ alicyclic group, and a (meth)acrylic monomer containing a $C_3$ to $C_{10}$ hetero-alicyclic group having at least one of nitrogen (N), oxygen (O), and sulfur (S).

The curing agent is a polyfunctional (meth)acrylate and may include a bifunctional (meth)acrylate such as hexanediol diacrylate; a trifunctional (meth)acrylate such as trimethylolpropane tri(meth)acrylate; a tetra-functional (meth) acrylate such as pentaerythritol tetra(meth)acrylate; a penta-functional (meth)acrylate such as dipentaerythritol penta (meth)acrylate; and a hexa-functional (meth)acrylate such as dipentaerythritol hexa(meth)acrylate, without being limited thereto.

The photoinitiator is a typical photoinitiator and may include the photo-radical initiator described above.

The silane coupling agent may include an epoxy group-containing silane coupling agent such as 3-glycidoxypropyltrimethoxysialne.

The adhesive composition may include 100 parts by weight of the (meth)acrylic resin, about 0.1 parts by weight to about 30 parts by weight of the curing agent, about 0.1 parts by weight to about 10 parts by weight of the photoinitiator, and about 0.1 parts by weight to about 20 parts by weight of the silane coupling agent. With this composition, the adhesive layer formed of the adhesive composition allows the flexible window film to be sufficiently attached to the display part, the touchscreen panel, or the polarizing plate.

The adhesive layer (130) may have a thickness of about 10 μm to about 100 μm. Within this range, the adhesive layer can sufficiently attach the flexible window film to an optical device such as a polarizing plate.

Figure 3:
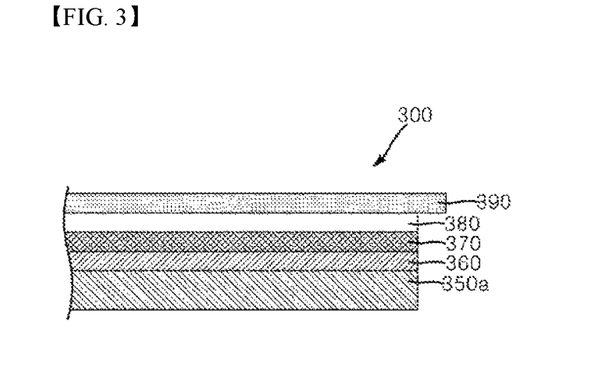
FIG. 3 is a cross-sectional view of a flexible display according to one embodiment of the present invention.
Figure 4:
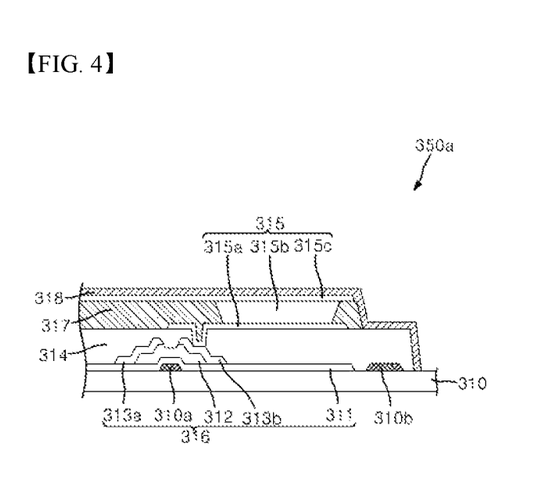
FIG. 4 is a cross-sectional view of one embodiment of a display part shown in FIG. 3.

Next, a flexible display according to one embodiment will be described with reference to FIG. 3 and FIG. 4. FIG. 3 is a cross-sectional view of a flexible display according to one embodiment of the present invention and FIG. 4 is a cross-sectional view of one embodiment of a display part shown in FIG. 3.

Referring to FIG. 3, a flexible display (300) according to one embodiment of the invention includes a display part (350a), an adhesive layer (360), a polarizing plate (370), a touchscreen panel (380), and a flexible window film (390), which may include the flexible window film according to the embodiments of the invention.

The display part (350a) serves to drive the flexible display (300) and may include a substrate and an optical device formed on the substrate and including an OLED, an LED or an LCD device. FIG. 4 is a cross-sectional view of one embodiment of the display part shown in FIG. 3. Referring to FIG. 4, the display part (350a) includes a lower substrate (310), a thin film transistor (316), an organic light emitting diode (315), a flattening layer (314), a protective layer (318), and an insulating layer (317).

The lower substrate (310) supports the display part (350a), and the thin film transistor (316) and the organic light emitting diode (315) may be formed on the lower substrate (310). The lower substrate (310) may be formed with a flexible printed circuit board (FPCB) for driving the touchscreen panel (380). The flexible printed circuit board may further include a timing controller, a power source, and the like in order to drive an array of organic light emitting diodes.

The lower substrate (310) may include a substrate formed of a flexible resin. Specifically, the lower substrate (310) may include a flexible substrate such as a silicone substrate, a polyimide substrate, a polycarbonate substrate, and a polyacrylate substrate, without being limited thereto.

In a display area of the lower substrate (310), plural pixel domains are defined by plural driving wires (not shown) and plural sensor wires (not shown) intersecting each other and each of the pixel domains may be formed with an array of organic light emitting diodes, each of which includes the thin film transistor (316) and the organic light emitting diode (315) connected to the thin film transistor (316). In a non-display area of the lower substrate, a gate driver applying electric signals to the driving wires may be formed in the form of a gate-in panel. The gate-in panel circuit may be formed at one or both sides of the display area.

The thin film transistor (316) controls electric current flowing through a semiconductor by application of an electric field perpendicular to the electric current and may be formed on the lower substrate (310). The thin film transistor (316) may include a gate electrode (310a), a gate insulation layer (311), a semiconductor layer (312), a source electrode (313a), and a drain electrode (313b). The thin film transistor (316) may be an oxide thin film transistor which uses an oxide such as indium gallium zinc oxide (IGZO), ZnO, or TiO as the semiconductor layer, an organic thin film transistor which uses an organic material as the semiconductor layer, an amorphous silicon thin film transistor which uses amorphous silicon as the semiconductor layer, or a polycrystalline silicon thin film transistor which uses polycrystalline silicon as the semiconductor layer.

The flattening layer (314) covers the thin film transistor (316) and a circuit section (310b) to flatten upper surfaces of the thin film transistor (316) and the circuit section (310b) such that the organic light emitting diode (315) can be formed thereon. The flattening layer may be formed of a spin-on-glass (SOG) film, a polyimide polymer, or a polyacrylic polymer, without being limited thereto.

The organic light emitting diode (315) realizes a display through self-emission, and may include a first electrode (315a), an organic light-emitting layer (315b), and a second electrode (315c), which are stacked in the stated order. Adjacent organic light emitting diodes may be isolated from each other by the insulating layer (317). The organic light emitting diode (315) may have a bottom emission type structure wherein light generated from the organic light-emitting layer (315b) is emitted through the lower substrate, or a top-emission type structure wherein light from the organic light-emitting layer (315b) is emitted through an upper substrate.

The protective layer (318) covers the organic light emitting diodes to protect the organic light emitting diodes. The protective layer (318) may be formed of an inorganic material such as $SiO_x$, $SiN_x$, SiC, SiON, SiONC, and amorphous carbon (a-C), or an organic material such as (meth)acrylates, epoxy polymers, imide polymers, and the like. Specifically, the protective layer (318) may include an encapsulation layer in which an inorganic material layer and an organic material layer are sequentially stacked once or plural times.

Referring again to FIG. 3, the adhesive layer (360) serves to attach the display part (350a) to the polarizing plate (370), and may be formed of an adhesive composition including a (meth)acrylate resin, a curing agent, an initiator, and a silane coupling agent.

The polarizing plate (370) can realize polarization of internal light or prevent reflection of external light to realize a display, or can increase contrast of the display. The polarizing plate may be composed of a polarizer alone. Alternatively, the polarizing plate may include a polarizer and a protective film formed on one or both surfaces of the polarizer. Alternatively, the polarizing plate may include a polarizer and a protective coating layer formed on one or both surfaces of the polarizer. As the polarizer, the protective film and the protective coating layer, a typical polarizer, a typical protective film and a typical protective coating layer known in the art may be used.

The touchscreen panel (380) generates electrical signals through detection of variation in capacitance when a human body or a conductor such as a stylus touches the touchscreen panel, and the display part (350a) may be driven by such electrical signals. The touchscreen panel (380) is formed by patterning a flexible conductor, and may include first sensor electrodes and second sensor electrodes each formed between the first sensor electrodes and intersecting the first sensor electrodes. The touchscreen panel (380) may include a conductive material such as metal nanowires, conductive polymers, and carbon nanotubes, without being limited thereto.

The flexible window film (390) may be disposed as an outermost layer of the flexible display (300) to protect the flexible display.

Although not shown in FIG. 3, adhesive layers may be further formed between the polarizing plate (370) and the touchscreen panel (380) and/or between the touchscreen panel (380) and the flexible window film (390) to reinforce coupling between the polarizing plate, the touchscreen panel, and the flexible window film. The adhesive layers may be formed of an adhesive composition including a (meth)acrylate resin, a curing agent, an initiator, and a silane coupling agent. Although not shown in FIG. 3, a polarizing plate may be disposed under the display part (350a) to realize polarization of internal light.

Figure 5:
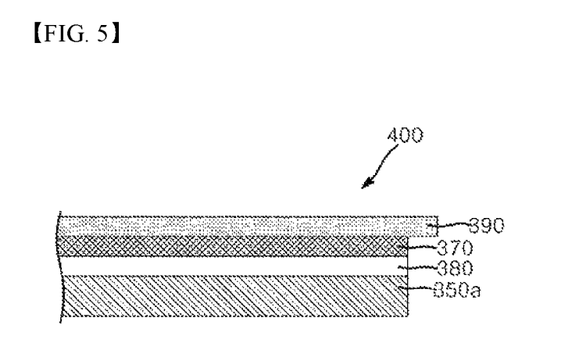
FIG. 5 is cross-sectional view of a flexible display according to another embodiment of the present invention.

Next, a flexible display according to another embodiment of the present invention will be described with reference to FIG. 5. FIG. 5 is a cross-sectional view of a flexible display according to another embodiment of the present invention.

Referring to FIG. 5, a flexible display (400) according to another embodiment of the invention includes a display part (350a), a touchscreen panel (380), a polarizing plate (370), and a flexible window film (390), which may include the flexible window film according to the embodiments of the invention. The flexible display according to this embodiment is substantially the same as the flexible display according to the above embodiment except that the touchscreen panel (380) is disposed under the polarizing plate (370) instead of being directly formed on the flexible window film (390). In addition, the touchscreen panel (380) may be formed together with the display part (350a). In this case, since the touchscreen panel (380) is formed together with the display part (350a) on the display part (350a), the flexible display according to this embodiment is thinner and brighter than the flexible display according to the above embodiment, thereby providing better visibility. In addition, the touchscreen panel (380) may be formed by deposition, without being limited thereto. Although not shown in FIG. 5, adhesive layers may be further formed between the display part (350a) and the touchscreen panel (380), between the touchscreen panel (380) and the polarizing plate (370), and/or between the polarizing plate (370) and the flexible window film (390) to reinforce mechanical strength of the display. The adhesive layers may be formed of an adhesive composition including a (meth)acrylate resin, a curing agent, an initiator, and a silane coupling agent. Although not shown in FIG. 5, a polarizing plate may be disposed under the display part (350a) to provide a good display image through polarization of internal light.

Figure 6:
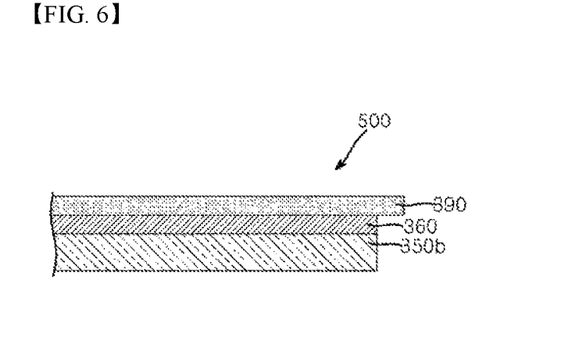
FIG. 6 is a cross-sectional view of a flexible display according to a further embodiment of the present invention.

Next, a flexible display according to a further embodiment of the present invention will be described with reference to FIG. 6. FIG. 6 is a cross-sectional view of a flexible display according to a further embodiment of the present invention. Referring to FIG. 6, a flexible display (500) according to a further embodiment of the invention includes a display part (350b), an adhesive layer (360), and a flexible window film (390), which may include the flexible window film according to the embodiments of the invention. The flexible display according to this embodiment is substantially the same as the flexible display according to the one embodiment except that the flexible display can be driven by the display part (350b) alone and the polarizing plate and the touchscreen panel are omitted.

The display part (350b) may include a substrate and an optical device formed on the substrate and including an OLED, an LED or an LCD device. The display part (350b) may further include a touchscreen panel therein.

Hereinafter, the present invention will be described in more detail with reference to some examples. It should be understood that these examples are provided for illustration only and are not to be construed in any way as limiting the present invention.

Example 1

50 g of a monomer mixture comprising 95 mol % of 2-(3,4-epoxycyclohexyl)ethyltriethoxysilane (Sigma-Aldrich) and 5 mol % of dimethyldimethoxysilane(Sigma-Aldrich) was placed in a 200 ml 2-neck flask. To the monomer mixture, 2 mol % of KOH and 1 mol % of water were added, followed by stirring at 65° C. for 4 hours. A siloxane resin was prepared through removal of remaining water and alcohol using a vacuum distillation device, and methylethylketone was added thereto to obtain 90 wt % of the siloxane resin in terms of solid content. The siloxane resin had a weight average molecular weight of 6,200 as measured by gel permeation chromatography.

A composition for window films was prepared by mixing 100 parts by weight of the prepared siloxane resin and 5 parts by weight of a photocationic initiator (DPI-HFP, Sigma-Aldrich). The prepared composition was coated onto a polyethylene terephthalate film (TA043, Toyobo, thickness: 80 μm), followed by drying at 100° C. for 5 minutes, irradiation with UV light at 1,000 mJ/cm$^2$, and heating at 80° C. for 4 hours, thereby preparing a window film having a 50 μm thick coating layer.

Example 2

50 g of a monomer mixture comprising 95 mol % of 2-(3,4-epoxycyclohexyl)ethyltriethoxysilane(Sigma-Aldrich) and 5 mol % of dimethyldimethoxysilane(Sigma-Aldrich) was placed in a 200 ml 2-neck flask. To the monomer mixture, 2 mol % of KOH and 1 mol % of water were added, followed by stirring at 65° C. for 4 hours. A siloxane resin was prepared through removal of remaining water and alcohol using a vacuum distillation device, and methylethylketone was added thereto to obtain 90 wt % of the siloxane resin in terms of solid content. The siloxane resin had a weight average molecular weight of 6,200 as measured by gel permeation chromatography.

A composition for window films was prepared by mixing 100 parts by weight of the prepared siloxane resin, 10 parts by weight of a crosslinking agent (CY-179, CIBA), and 5 parts by weight of a photocationic initiator (DPI-HFP, Sigma-Aldrich). The prepared composition was coated onto a polyethylene terephthalate film (TA043, Toyobo, thickness: 80 μm), followed by drying at 100° C. for 5 minutes, irradiation with UV light at 1,000 mJ/cm$^2$, and heating at 80° C. for 4 hours, thereby preparing a window film having a 50 μm thick coating layer.

Examples 3 to 5

Each of window films was prepared in the same manner as in Example 2 except that the mole ratio of the silicon monomers and the kind and amount of the photocationic initiator were changed as listed in Table 1.

Example 6

50 g of a monomer mixture comprising 95 mol % of 2-(3,4-epoxycyclohexyl)ethyltriethoxysilane and 5 mol % of 2-(3,4-epoxycyclohexyl)ethylmethyldiethoxysilane was placed in a 200 ml 2-neck flask. To the monomer mixture, 2 mol % of KOH and 1 mol % of water were added, followed by stirring at 65° C. for 4 hours. A siloxane resin was prepared through removal of remaining water and alcohol using a vacuum distillation device, and methylethylketone was added thereto to obtain 90 wt % of the siloxane resin in terms of solid content. The siloxane resin had a weight average molecular weight of 6,200 as measured by gel permeation chromatography. A window film was prepared using the prepared siloxane resin in the same manner as in Example 2.

Example 7

A window film was prepared in the same manner as in Example 2 except that 10 parts by weight of diglycidyl 1,2-cyclohexanedicarboxylate (Sigma Aldrich) was used instead of 10 parts by weight of the crosslinking agent CY-179 (CIBA).

Example 8

400 g of a monomer mixture comprising 95 mol % of 2-(3,4-epoxycyclohexyl)ethyltrimethoxysilane(KBM-303, Shin-Etsu Chemicals Co., Ltd.) and 5 mol % of (3-glycidoxypropyl)trimethoxysilane(KBM-403, Shin-Etsu Chemicals Co., Ltd.) was placed in a 1 L 3-neck flask. To the monomer mixture, 0.1 mol % of KOH based on the amount of the monomer mixture and 1 equivalent weight of water based on the total amount of the silicon monomers were added, followed by stirring at 65° C. for 8 hours and washing with toluene. Then, a siloxane resin represented by $(EcSiO_{3/2})_{0.95}(GpSiO_{3/2})_{0.05}$ (weight average molecular weight: 5,500 as measured by GPC) was prepared through concentration of the resulting material. A window film was prepared using the siloxane resin in the same manner as in Example 2.

Comparative Example 1

A window film was prepared in the same manner as in Example 2 except that 5 parts by weight of CPI-100P (SanApro) was used instead of 5 parts by weight of DPI-HFP (Sigma-Aldrich).

Comparative Example 2

A window film was prepared in the same manner as in Example 2 except that 5 parts by weight of CPI-101A (SanApro) was used instead of 5 parts by weight of DPI-HFP (Sigma-Aldrich).

Details of the compositions for window films prepared in Examples and Comparative Examples are shown in Table 1. The window films prepared in Examples and Comparative Examples were evaluated as to Properties (1) to (3) and evaluation results are shown in Table 1.

1. Pencil hardness: Pencil hardness was measured on a coating layer of a window film using a pencil hardness tester (Heidon) in accordance with JIS K5400. Pencil hardness was measured using pencils of 6B to 9H (Mitsubishi Co., Ltd.) under conditions of a pencil load of 1 kg on the coating layer, a scratch angle of 45°, and a scratch speed of 60 mm/min. When the coating layer had one or more scratches after being tested 5 times using a certain pencil, pencil hardness was measured again using another pencil having one-level lower pencil hardness than the previous pencil. A pencil hardness value allowing no scratch to be observed all five times on the coating layer was taken as pencil hardness of the coating layer.

2. Radius of curvature: A window film (thickness×width× length, 3 cm×15 cm×130 μm, base layer thickness: 80 μm, coating layer thickness: 50 μm) was wound around a jig for measuring a radius of curvature (CFT-200R, COVOTECH Co., Ltd.), kept wound for 5 seconds or more, unwound, and then observed with the naked eye to determine whether the window film had cracks. Here, a radius of curvature in a compressive direction was measured by winding the window film around the jig such that the coating layer of the window film contacted the jig, and a radius of curvature in a tensile direction was measured by winding the window film around the jig such that the base layer of the window film contacted the jig. The radius of curvature was determined as a minimum radius of a jig causing no cracks on the window film, as measured in the compression direction while gradually decreasing the diameters of jigs from a jig having the maximum diameter.

3. Initial yellow index and light resistant reliability: A yellow index (Y1) was measured on a window film under a D65 light source at 2° (angle between the window film and the light source) using a colorimeter (CM3600A, Konica Minolta). Then, a yellow index (Y2) was measured on the window film by the same method after irradiating the window film at a peak wavelength of 306 nm for 72 hours using a light resistance tester (CT-UVT, Core Technology Inc.). Light resistant reliability was determined based on a difference in yellow index (Y2-Y1, ΔY.I.) between before irradiation and after irradiation.

TABLE 1

| | | Example | | | | | | | | Comparative Example | |
|---|---|---|---|---|---|---|---|---|---|---|---|
| | | 1 | 2 | 3 | 4 | 5 | 6 | 7 | 8 | 1 | 2 |
| Silicon monomer (mol %) | 2-(3,4-epoxycyclohexyl)ethyl-triethoxysilane | 95 | 95 | 90 | 95 | 95 | 95 | 95 | — | 95 | 95 |
| | dimethyldimethoxysilane | 5 | 5 | 10 | 5 | 5 | — | 5 | — | 5 | 5 |
| | 2-(3,4-epoxycyclohexyl)ethyl-methyldiethoxysilane | — | — | — | — | — | 5 | — | — | — | — |
| | 2-(3,4-epoxycyclohexyl)ethyl-trimethoxysilane | — | — | — | — | — | — | — | 95 | — | — |
| | (3-glycidoxypropyl)tri-methoxysilane | — | — | — | — | — | — | — | 5 | — | — |
| Crosslinking agent (parts by weight) | CY-179 | — | 10 | 10 | 10 | 10 | 10 | — | 10 | 10 | 10 |
| | diglycidyl 1,2-cyclohexane-dicarboxylate | — | — | — | — | — | — | 10 | — | — | — |
| Initiator (Parts by weight) | Initiator 1 | 5 | 5 | 5 | — | — | 5 | 5 | 5 | — | — |
| | Initiator 2 | — | — | — | 5 | — | — | — | — | — | — |
| | Initiator 3 | — | — | — | — | 5 | — | — | — | — | — |
| | Initiator 4 | — | — | — | — | — | — | — | — | 5 | — |
| | Initiator 5 | — | — | — | — | — | — | — | — | — | 5 |
| | Pencil hardness | 7H | 8H | 7H | 8H | 8H | 8H | 7H | 8H | 8H | 8H |
| | Radius of curvature (mm) | 3.7 | 3.1 | 2.6 | 3.2 | 3.0 | 3.0 | 3.5 | 3.1 | 3.1 | 3.3 |
| | Initial yellow index | 0.8 | 0.8 | 0.8 | 0.8 | 0.8 | 0.9 | 0.9 | 0.8 | 1.0 | 0.9 |
| | Light resistant reliability (ΔY.I.) | 0.9 | 0.9 | 0.8 | 0.9 | 0.8 | 0.8 | 0.9 | 0.8 | 5.4 | 6.9 |

*Photocationic initiator 1: DPI-HFP (Aldrich, diphenyliodonium hexafluorophosphate)
*Photocationic initiator 2: Irgacure 250 (BASF, (4-methylphenyl)[4-(2-methylpropyl)phenyl]iodonium hexafluorophosphate)
*Photocationic initiator 3: TR-PAG 30208 (Tronly, bis(4-tert-butylphenyl)iodonium tetrakis(pentafluorophenyl)borate)
*Photocationic initiator 4: CPI-100P (SanApro, diphenyl-4-(phenylthio)phenylsulfonium hexafluorophosphate)
*Photocationic initiator 5: CPI-101A (SanApro, diphenyl-4-(phenylthio)phenylsulfonium hexafluoroantimonate)

As shown in Table 1, the window films of Examples had good light resistant reliability, high pencil hardness, and low radii of curvature, which mean good flexibility, and thus could be used as a window film for flexible displays.

However, as shown in Table 1, the window films of Comparative Examples 1 and 2, each of which was prepared using the composition including the siloxane resin according to the present invention and free from the iodonium ion-containing photocationic initiator, had a problem of low light resistant reliability, despite the same or higher hardness than the window films of Examples.

It should be understood that various modifications, changes, alterations, and equivalent embodiments can be made by those skilled in the art without departing from the spirit and scope of the invention.

The invention claimed is:

1. A composition for window films, comprising: a siloxane resin represented by Chemical Formula 1; and an iodonium ion-containing photocationic initiator:

$(R^1SiO_{3/2})_x(R^2R^3SiO_{2/2})_y$     <Chemical Formula 1> wherein in Chemical Formula 1, $R^1$ is a crosslinkable functional group; $R^2$ and $R^3$ are each independently hydrogen, a crosslinkable group, an unsubstituted or substituted $C_1$ to $C_{20}$ alkyl group, or an unsubstituted or substituted $C_5$ to $C_{20}$ cycloalkyl group, at least one of $R^2$ and $R^3$ being an unsubstituted or substituted $C_1$ to $C_{20}$ alkyl group; and $0<x\leq1$, $0\leq y<1$, and $x+y=1$, and wherein the siloxane resin represented by Chemical Formula 1 has a weight average molecular weight of 4,500 to 100,000.

2. The composition for window films according to claim 1, wherein the iodonium ion-containing photocationic initiator is present in an amount of about 1 part by weight to about 15 parts by weight relative 100 parts by weight of the siloxane resin.

3. The composition for window films according to claim 1, wherein the iodonium ion-containing photocationic initiator comprises one diaryliodonium selected from diphenyliodonium, 4-methoxydiphenyliodonium, bis(4-methylphenyl)iodonium, bis(4-tert-butylphenyl)iodonium, bis(4-dodecylphenyl)iodonium, and (4-methylphenyl)[4-(2-methylpropyl)phenyl]iodonium, and one anion selected from hexafluorophosphate, tetrafluoroborate, tetrakis(pentafluorophenyl)borate, hexafluoroantimonate, hexafluoroarsenate, hexachloroantimonate, nitrate, para-toluenesulfonate, 9,10-dimethoxyanthracene-2-sulfonate, triflate, and perfluoro-1-butanesulfonate.

4. The composition for window films according to claim 3, wherein the iodonium ion-containing photocationic initiator comprises at least one selected from diphenyliodonium hexafluorophosphate,-(4-methylphenyl)[4-(2-methylpropyl)phenyl]iodonium hexafluorophosphate, and bis(4-tert-butylphenyl)iodonium tetrakis(pentafluorophenyl)borate.

5. The composition for window films according to claim 1, wherein the siloxane resin comprises at least one of compounds represented by Chemical Formula 1-1 to 1-13:

$(EcSiO_{3/2})_x(EcMeSiO_{2/2})_y$     <Chemical Formula 1-1>

$(EcSiO_{3/2})_x((Me)_2SiO_{2/2})_y$     <Chemical Formula 1-2>

$(EcSiO_{3/2})_x(MeEtSiO_{2/2})_y$     <Chemical Formula 1-3>

$(EcSiO_{3/2})_x(GpMeSiO_{2/2})_y$     <Chemical Formula 1-4>

$(GpSiO_{3/2})_x(EcMeSiO_{2/2})_y$ <Chemical Formula 1-5>

$(GpSiO_{3/2})_x((Me)_2SiO_{2/2})_y$ <Chemical Formula 1-6>

$(GpSiO_{3/2})_x(MeEtSiO_{2/2})_y$ <Chemical Formula 1-7>

$(GpSiO_{3/2})_x(GpMeSiO_{2/2})_y$ <Chemical Formula 1-8>

$(OpSiO_{3/2})_x(EcMeSiO_{2/2})_y$ <Chemical Formula 1-9>

$(OpSiO_{3/2})_x((Me)_2SiO_{2/2})_y$ <Chemical Formula 1-10>

$(OpSiO_{3/2})_x(MeEtSiO_{2/2})_y$ <Chemical Formula 1-11>

$(OpSiO_{3/2})_x(GpMeSiO_{2/2})_y$ <Chemical Formula 1-12> wherein in Chemical Formula 1-1 to 1-12, Ec is a (3,4-epoxycyclohexyl)ethyl group, Me is a methyl group, Et is an ethyl group, Gp is a 3-glycidoxypropyl group, Op is a 3-oxetanylpropyl group, and $0<x<1$, $0<y<1$, and $x+y=1$, $(EcSiO_{3/2})_{x1}(GpSiO_{3/2})_{x2}$ <Chemical Formula 1-13> wherein in Chemical Formula 1-13, Ec is a (3,4-epoxycyclohexyl)ethyl group, Gp is a 3-glycidoxypropyl group, and $0<x1<1$, $0<x2<1$, and $x1+x2=1$.

6. The composition for window films according to claim 1, further comprising: a crosslinking agent.

7. The composition for window films according to claim 6, wherein the crosslinking agent comprises at least one of a non-cyclic aliphatic epoxy monomer, a cyclic aliphatic epoxy monomer, an aromatic epoxy monomer, and a hydrogenated aromatic epoxy monomer.

8. A flexible window film comprising a base layer and a coating layer formed on one surface of the base layer, wherein the coating layer comprises an iodonium ion-containing photocationic initiator, wherein the coating layer is formed from a composition for window films, comprising: a siloxane resin represented by Chemical Formula 1 and the iodonium ion-containing photocationic initiator:

$(R^1SiO_{3/2})_x(R^2R^3SiO_{2/2})_y$ <Chemical Formula 1> wherein in Chemical Formula 1, $R^1$ is a crosslinkable functional group; $R^2$ and $R^3$ are each independently hydrogen, a crosslinkable group, an unsubstituted or substituted $C_1$ to $C_{20}$ alkyl group, or an unsubstituted or substituted $C_5$ to $C_{20}$ cycloalkyl group, at least one of $R^2$ and $R^3$ being an unsubstituted or substituted $C_1$ to $C_{20}$ alkyl group; and $0<x\leq1$, $0\leq y<1$, and $x+y=1$, wherein the siloxane resin represented by Chemical Formula 1 has a weight average molecular weight of 4,500 to 100,000 and wherein the iodonium ion-containing photocationic initiator comprises:
at least one diaryliodonium selected from 4-methoxydiphenyliodonium, bis(4-methylphenyl)iodonium, bis(4-tert-butylphenyl)iodonium, bis(4-dodecylphenyl)iodonium, and (4-methylphenyl)[4-(2-methylpropyl)phenyl]iodonium, and at least one anion selected from hexafluorophosphate, tetrafluoroborate, tetrakis(pentafluorophenyl)borate, hexafluoroantimonate, hexafluoroarsenate, hexachloroantimonate, nitrate, para-toluenesulfonate, 9,10-dimethoxyanthracene-2-sulfonate, triflate, and perfluoro-1-butanesulfonate; or
diphenyliodonium and at least one anion selected from tetrafluoroborate, tetrakis(pentafluorophenyl)borate, hexafluoroarsenate, hexachloroantimonate, nitrate, para-toluenesulfonate, 9,10-dimethoxyanthracene-2-sulfonate, triflate, and perfluoro-1-butanesulfonate.

9. The flexible window film according to claim 8, further comprising: an adhesive layer formed on the other surface of the base layer.

10. The flexible window film according to claim 8, wherein the flexible window film has a ΔY.I of about 1.0 or less.

11. A flexible display comprising the flexible window film according to claim 8.

12. The flexible display according to claim 11, wherein the flexible display comprises a display part, an adhesive layer formed on the display part, a polarizing plate formed on the adhesive layer, a touchscreen panel formed on the polarizing plate, and the flexible window film formed on the touchscreen panel.

13. The flexible display according to claim 11, wherein the flexible display comprises a display part, a touchscreen panel formed on the display part, a polarizing plate formed on the touchscreen panel and the flexible window film formed on the polarizing plate.

14. The flexible display according to claim 11, wherein the flexible display comprises a display part, an adhesive layer formed on the display part and the flexible window film formed on the adhesive layer.

15. The flexible display according to claim 14, wherein the display part further comprises a polarizing plate disposed at an upper or lower side thereof.

\* \* \* \* \*